United States Patent [19]
Robinson et al.

[11] Patent Number: 5,802,553
[45] Date of Patent: *Sep. 1, 1998

[54] FILE SYSTEM CONFIGURED TO SUPPORT VARIABLE DENSITY STORAGE AND DATA COMPRESSION WITHIN A NONVOLATILE MEMORY

[75] Inventors: Kurt B. Robinson, Newcastle; Clark S. Thurlo, Folsom, both of Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 574,646

[22] Filed: Dec. 19, 1995

[51] Int. Cl.$^6$ .................................................. G06F 12/00
[52] U.S. Cl. ................................. 711/103; 395/182.04
[58] Field of Search ......................... 395/430, 182.04; 711/103

[56] References Cited

U.S. PATENT DOCUMENTS

| | | | |
|---|---|---|---|
| 4,896,262 | 1/1990 | Wayama et al. | 395/500 |
| 5,070,474 | 12/1991 | Tuma et al. | 395/500 |
| 5,131,089 | 7/1992 | Cole | 395/500 |
| 5,172,342 | 12/1992 | Gochi | 365/226 |
| 5,267,218 | 11/1993 | Elbert | 365/185.04 |
| 5,297,148 | 3/1994 | Harari et al. | 371/10.2 |
| 5,515,317 | 5/1996 | Wells et al. | 711/100 |
| 5,524,230 | 6/1996 | Sakaue et al. | 711/103 |
| 5,532,945 | 7/1996 | Robinson | 711/115 |
| 5,535,369 | 7/1996 | Wells et al. | 711/171 |
| 5,541,886 | 7/1996 | Hasbun | 365/230.01 |
| 5,602,987 | 2/1997 | Harari et al. | 395/182.06 |

OTHER PUBLICATIONS

PCMCIA Card Services Specification, PC Card Standard vol. 5, Personal Computer Memory Card International Association, Feb. 1995.
PCMCIA Socket Services Specification, PC Card Standard vol. 6, Personal Computer Memory Card International Association, Feb. 1995.

*Primary Examiner*—Eddie P. Chan
*Assistant Examiner*—Reginald G. Bragdon
*Attorney, Agent, or Firm*—Blakely, Sokoloff, Taylor & Zafman

[57] ABSTRACT

A storage system contains a solid state disk drive having a plurality of memory cells to store the files, including file system control information and data. In a high density mode, the solid state disk drive stores more than one bit per memory cell, and in a reliable mode, the solid state disk drive stores one bit per cell. A file configuration system stores file system control information in the reliable mode and stores data, when specified, in the high density mode. The file configuration system includes a multi-level cell extension unit that generates commands to the memory cells. A data compression unit is provided to compress file data. A block size for the data compression unit is calculated in accordance with the number of bits per cell stored in the high density mode. The file configuration system further includes an error detection and correction (EDC) unit to detect and correct data stored in the high density mode. The storage system may be implemented to operate with the personal computer memory card industry association (PCMCIA) standard.

10 Claims, 5 Drawing Sheets

FILE SYSTEM CONFIGURED TO SUPPORT VARIABLE DENSITY STORAGE AND DATA COMPRESSION WITHIN A NONVOLATILE MEMORY

FIELD OF THE INVENTION

The present invention relates to the field of data storage, and more particularly to storing data in a solid state disk drive capable of storing more than a single bit per cell.

BACKGROUND OF THE INVENTION

Solid state disk drives have application as mass storage devices for computer systems. For example, solid state disk drives that contain a plurality of non-volatile memory cells consume less power in operation than conventional magnetic disk drives. Solid state disk drives may be constructed of electrically erasable and programmable memory cells, such as flash memory cells. The flash memory cells contain floating gates capable of retaining charge, and exhibit a threshold of conductivity based on the amount of charge stored on the floating gate. The flash memory cells may be programmed to store more than a single bit of data for each cell. In order to store, for example, two bits of data per flash memory cell, one of four pre-determined threshold levels of charge are programmed on the floating gate to represent the two bits of data.

Solid state disk drives that store more than a single bit of data for each memory cell increase the density of storage for the mass storage device. However, as a trade off to increased density, the storage of more than a single bit of data per cell often decreases the reliability of the device. Therefore, it is desirable to maintain reliability in a solid state disk drive capable of storing more than one bit per cell.

Typically, computer systems store files on mass storage devices. The files include both files and file system control information. In order to access the files on the mass storage device, the computer system employs file systems. For a particular computer system, the file system is standardized such that a first computer stores files on a storage device that are accessible by a second computer operating with the same file system. Obviously, such standardization of file systems is desirable to maintain compatibility. However, solid state disk drives that store more than a single bit per cell require additions or extensions to the file system and/or low level drivers. It is desirable to provide extensions to a file system to access data that is stored in more than a single bit per cell while maintaining a high level of compatibility with prior file systems.

SUMMARY OF THE INVENTION

A storage system contains a solid state disk drive to store files, including file system control information and files. The solid state disk drive contains a plurality of memory cells to store the files, and each memory cell is capable of storing more than a single bit of data. In a high density mode, the solid state disk drive stores more than one bit per memory cell, and in a reliable mode, the solid state disk drive stores one bit per cell such that error detection and correction is not required. The storage system also contains a file configuration system that accesses the solid state disk drive for storage of the files. The file configuration system stores file system control information in the reliable mode and stores data, when specified, in the high density mode.

A control structure includes a multi-level cell identification to identify whether the data corresponding to the control structure is stored in the high density mode or the reliable mode. In order to operate on the memory cells in the high density mode, the file configuration system includes a multi-level cell extension unit that generates primitive commands to the memory cells (e.g. multi-level cell write, multi-level cell read, multi-level cell copy and multi-level cell erase operations).

In one embodiment, the file configuration system contains a data compression unit to compress the data. For the data compression embodiment, the multi-level cell extension unit includes a multi-level cell compression extension to generate a block size for the data compression unit in accordance with a number of bits per cell stored in the high density mode. In another embodiment, the file configuration system includes an error detection and correction (EDC) unit to detect and correct data stored in the multi-level cell mode.

The storage system of the present invention may be implemented in accordance with the personal computer memory card industry association (PCMCIA) specification. For the PCMCIA embodiment, the storage system includes a media manager and a memory technology driver to implement the multi-level cell write, multi-level cell read, multi-level cell copy, and multi-level cell erase operations. In one embodiment, the operations are transferred from the media manager to the memory technology driver via a direct interface allowing the PCMCIA components to remain unaltered. In another embodiment, the operations are transferred from the media manager to the memory technology via additional operation codes through a PCMCIA card services module.

Other features and advantages of the present invention will be apparent from the accompanying drawings, and from the detailed description that follows below.

BRIEF DESCRIPTION OF THE DRAWINGS

The features and advantages of the present invention will be apparent from the following detailed description of the preferred embodiment of the invention with references to the following drawings.

DETAILED DESCRIPTION

Figure 1:
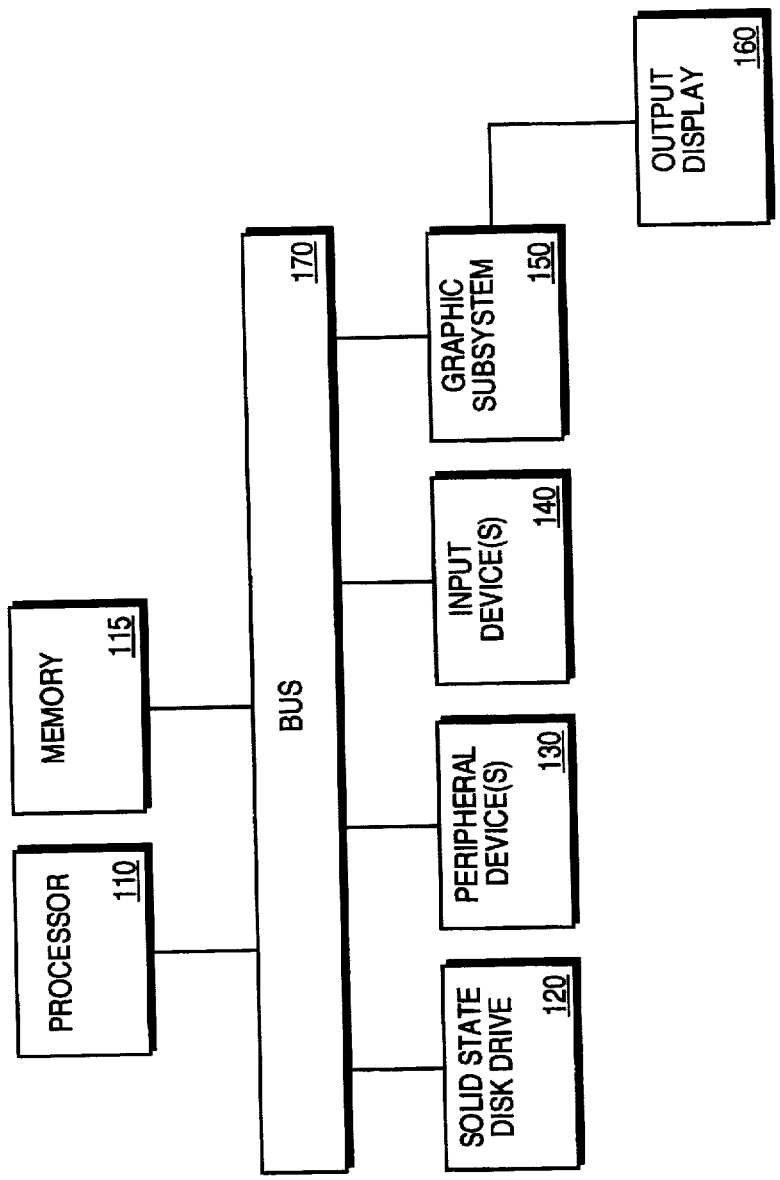
FIG. 1 illustrates a general purpose computer system for which the present invention may be implemented.

The present invention has application for use in a solid state disk drive. Typically, in a solid state disk drive, data are stored in nonvolatile memory cells. The solid state disk drive is constructed of cells that are electrically erasable and programmable. In one embodiment, the cells are flash electrically programmable read only memory cells (EPROM). Although the present invention is described in conjunction with flash EPROM cells, the cells may comprise any programmable and erasable cells such as electrically erasable programmable read only memory (EEPROM) cells without deviating from the spirit and scope of the invention. In a preferred embodiment, the flash EPROM cells are constructed as field effect transistors having floating gates capable of retaining charge. The amount or level of charge stored on the floating gate of the flash EPROM cell determines the state stored within the particular cell.

In the present invention, the flash EPROM cell is capable of storing multiple levels to store, in one mode, more than one bit per cell. For example, in order to store two bits per cell, a flash EPROM cell is capable of storing four discrete threshold levels. Each threshold level represents a different state for the flash EPROM cell. Conventionally, flash EPROM cells stored two states to represent one bit of information. The present invention utilizes the capability of storing one or more bits per cell in a solid state disk drive as is explained more fully below.

The solid state disk drive system stores information in a reliable mode and a high density mode. For purposes of explanation, the reliable mode is defined as the ability to store information in the flash EPROM memory cells without the use of error detection and correction techniques. For example, in certain flash EPROM technologies, the reliable mode may include storing data in one bit per cell (as is the conventional manner). For purposes of nomenclature, the high density mode is defined as storing data in more than one bit per cell. Typically, for flash EPROM cells, storing more than a single bit per cell requires error detection and correction techniques. The storage of data in the high density mode may include storing 1.5 bits per cell, two bits per cell, etc. Any number of bits per cell may be stored in the high density mode without deviating from the spirit and scope of the present invention.

As is explained more fully below, the present invention permits storage of files in a computer system on a solid state disk drive that is capable of storing one or more bits per cell while maintaining a high level of backward compatibility with current software systems. In the preferred embodiment, file system control information for files are stored in the reliable mode, and data associated with files are stored in the high density mode. By storing file system control information for a file in the reliable mode, error detection and correction is not required. In one embodiment, the reliable mode includes storing one bit per cell resulting in the control information remaining backward compatible with prior file systems.

FIG. 1 illustrates a general purpose computer system for which the present invention may be implemented. A computer system 100 includes at least one processor, such as processor 110, coupled to main memory 115. The processor 110 and memory 115 are coupled to a plurality of peripheral devices. Specifically, the processor 110 and memory 115 are coupled to a solid state disk drive 120, peripheral device(s) 130, input device(s) 140, graphic subsystem 150, and output display 160. In a preferred embodiment, the solid state disk drive 120 is constructed of flash EPROM memory cells, and associated circuitry, that are capable of storing multi-bits per cell.

The input device(s) 140 may include a keyboard, a pen based input device, a mouse, or any other input type device. The graphics subsystem 150 is coupled to an output display 160, and generates graphical output for the computer system 100. The bus 170 couples the peripheral device(s) to the processor 110 and memory 115. The computer system 100 is a general purpose computer system, and in fact, is intended to represent a broad category of such computer systems. For example, the processor 110 and memory 115 may be coupled on a local microprocessor bus, and the peripheral devices may be coupled on a peripheral component interconnect (PCI) bus, and/or an extended industry standard association (EISA) bus, and/or an industry standard association (ISA) bus.

Multi-Level Cell Extensions

Figure 2:
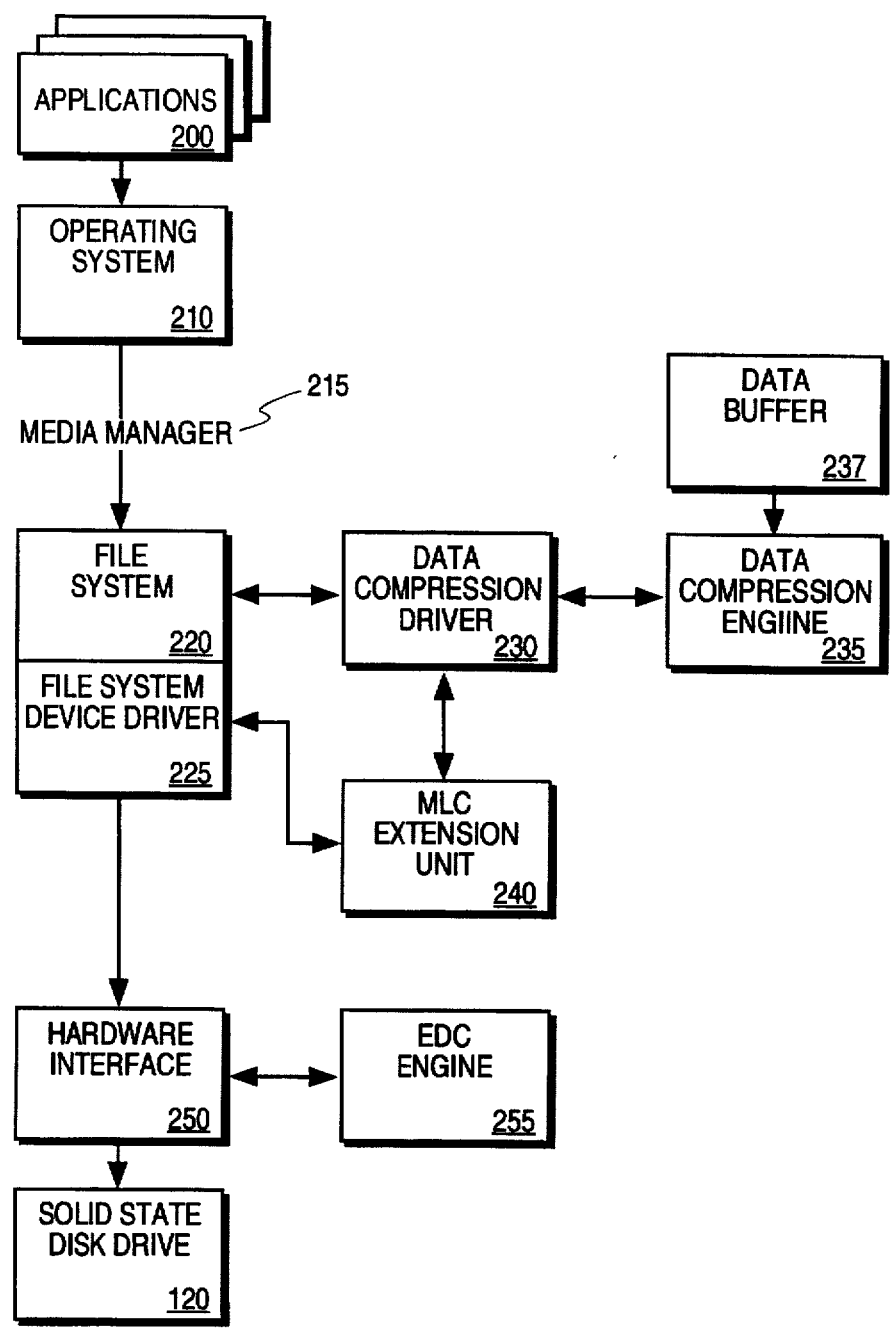
FIG. 2 is a block diagram illustrating one embodiment of an interface for a multi-level solid state disk drive.

FIG. 2 is a block diagram illustrating an interface for a multi-level solid state disk drive configured in accordance with one embodiment of the present invention. The interface includes one or more applications programs shown as application(s) 200 on FIG. 2. The application program(s) 200 includes any high level application program that requires access to a mass storage device, such as the solid state disk drive 120. Specifically, the application program(s) 200 store data, in the form of files, on the solid state disk drive 120. The applications program 200 are coupled to an operating system 210. In one embodiment, the operating system 210 is a Microsoft® Windows™ operating system. As is well known in the art, the operating system 210 receives requests for access to computer peripheral devices, such as the solid state disk drive 120.

In order to access the solid state disk drive 120, a software configuration contains a media manager 215 that includes a file system 220 and a file system device driver 225. In one embodiment, the file system 220 is a Microsoft® flash file system. For a complete discussion of the Microsoft® flash file system, see "Microsoft Flash File System—Media Control Structures," Version 1.0, 1994. For each file written to the solid state disk drive 120, the file system 220 generates a control structure. For the Microsoft® flash file system embodiment, the control structure includes a file entry, directory entries, and file information records (i.e. pointers to data and a corresponding file).

The file system 220 is coupled to a data compression driver 230, which in turn, is coupled to a data compression engine 235. The data compression engine 235 is coupled to a data buffer 237. In general, the file system 220 handles operating system level file storage requests, and translates the requests into gross physical operations on logical devices. The data compression driver 230 handles translation of compressed data in the physical medium to uncompressed data in the data buffer 237. The data compression engine 235 handles the numerical processing involved with the compression or decompression of data. The file system device driver 225 handles logical to physical translation of basic media access functions (e.g. read, write, copy, and erase operations).

In general, previously programmed flash EPROM cells require erasure before subsequent use based on the inherent characteristics of flash EPROM cell technology. For flash EPROM cells that store a single bit per cell, the flash memory stores a high logic level when no charge is retained on the floating gate, and a low logic level when charge is retained on the floating gate. Consequently, flash EPROM cells can't transition from a low logic level to a high logic level without undergoing an erase cycle because charge must be removed from the floating gate. However, the flash EPROM cells are programmed to transition from a high logic level to a low logic level without undergoing an erase cycle by placing charge on the floating gate. For purposes of nomenclature, the ability to transition a single flash EPROM cell from a high logic level to a low logic level without undergoing an erase cycle is entitled bit write-ability.

In a preferred embodiment, the file system 220 utilizes the bit write-ability nature of the flash EPROM cells to track status information without dedicating entire bytes or words to a specific status parameter or state. The file system 220 tracks status information by specifying that control structure bits are initially set to the unprogrammed state. Upon an occurrence of a predetermined event, the file system 220 transitions one or more control structure bits to a programmed state. For example, a block of flash EPROM cells that undergoes a clean-up operation contains status bits in the control structure that includes block status information.

The block status information is successively written to track each step in the process. Specifically, block status information is successively written to indicate: the block has been erased and reformatted as a spare block; the block is undergoing transfer of active control structures and file data from other blocks undergoing clean-up; the block has successfully been written to contain all file data transferred from other blocks and is now an active logic block; the block is now full and dirty and has been selected for clean-up; the block is currently undergoing transfer of data to another spare block, and the block has had all valid file data successfully transferred and has been placed in the queue for erasure. This example of control structure data manipulation illustrates the entire block reclamation process in which a file control structure contains bits that are successively written without block erasure. The above clean-up operation is merely exemplary, and other file system control structures contain similar bit writeable information, such as file attributes. Furthermore, other file control structures contain random data structure sizes, such as link list pointers, file name/data/time information, and file data storage fields.

The bit writeable in random sized file structures permits the file system 220 to maximize the utilization of the solid state disk drive 120. However, the single bit manipulation approach presents several problems when implementing multi-level cell techniques. The preferred embodiment of the present invention maintains this bit manipulation for altering the state of bits in the control structures without requiring erasure of the entire block.

As with all types of storage media, such as magnetic disk drives, reliability is sacrificed for lower cost when storing information on the media. Typically, reliability is restored through implementation of error detection and correction (EDC) schemes. EDC techniques are well known and applied to prior art data storage systems. However, EDC schemes are only efficiently applied to large and typically fixed size blocks of data. The EDC techniques require storage of error correctional codes (ECC) along with the associated data.

If error detection and correction schemes are implemented on file system control information, then the file system control information require ECC fields for each control structure state. Because flash EPROM technology is not directly byte alterable such that the ECC codes cannot be overwritten for each control structure transition, EDC schemes are not employed for file system control information that are bit alterable. Furthermore, even byte alterable non-volatile media could not support overwriting ECC codes because the writing cycle of the ECC byte would be multiplied by the number of states of the associated data.

File systems often include the ability to compress data for storage on a particular medium. For the block diagram illustrated in FIG. 2, data are compressed and decompressed in the data compression engine 235. For example, in an embodiment utilizing the Microsoft® flash file system, during a write operation, the data compression driver 230 may pass a four kilobyte (KB) buffer of data to the data compression engine 235. The data compression engine 235 executes a compression algorithm, and writes the compressed data to the data buffer 237. The file system 220 writes the size of the compressed data and the corresponding error correctional code (ECC) to the solid state disk drive 120. In addition, the file system 220 notes, in a compression bit in the control structure for the corresponding file, that the data was compressed. Note that only the data, and not the information contained within the controlled structures, are compressed. Therefore, a different system that reads the control structure may determine whether the corresponding data are compressed based on the state of the compression bit in the corresponding control structure.

The present invention writes file system control information in the reliable mode that does not require error detection and correction. In a preferred embodiment, the reliable mode writes to the solid state disk drive 120 such that each cell stores a single bit of data. However, reliable mode writes may also include writing more than a single bit to each memory cell. The data portion of files are written in the high density cell mode. The high density cell mode employs the highest number of cell states that yield the maximum bits per cell for reliably storing data using available error detection and correction techniques. Because all file system control information for the file system are written in the reliable mode, the problem with storing corresponding ECC bits with control structure data is eliminated.

The storing of the control structure data in the reliable mode of the present invention provides 100% backward compatibility with older file systems and device driver implementations. When the multi-level cell mode is used to write to the solid state disk drive 120, the older file system and device drivers remain compatible to read the file and directory structures, but cannot read the actual file data. Therefore, the high density cell mode data storage exhibits backward compatibility analogous to the compatibility for software compression used in one system that is not available in a second system attempting to read the file.

In general, writing data in the high density cell mode requires additional software control and algorithms that are implemented in the multi-level cell extension unit 240 shown on FIG. 2. The multi-level cell extension unit 240 is coupled to the data compression driver 230 and the file system device driver 225. The multi-level cell extension unit 240 calculates new block sizes for data compression for multi-level cell implementations. The block size is transferred to the data compression driver 230. In addition, the multi-level cell extension unit 240 generates special multi-level cell specific read, write, and copy commands to the solid state disk drive 120. The multi-level cell extension unit 240 specifies block sizes for data compression in accordance with the following relationship:

$$y = \frac{x}{w \cdot n} + z$$

where y is the calculated block size in terms of reliable mode equivalent number of bytes;

x represents the input block of data (in bytes) prior to both compression and formatting in the high density mode;

n is the compression factor;

w is the number of bits per cell; and z is the number of EDC bytes required for the compressed data being stored in high density mode.

EDC bytes are the number of bytes (rounded up to the next integer, if necessary), needed to store the number of EDC bits for correcting x/n bytes at a given error rate. For example, if an algorithm requires 39 EDC bits to detect and correct up to 3 bit errors for 512 bytes of compressed data (i.e., x/n=512), then z equals 5. The above equation assumes that the EDC bytes are stored in reliable mode. However, in an alternative embodiment, the EDC bytes are stored in high density mode. In such a case, an adjustment to the equation above is required so that z is appropriately scaled to z/w rounded up to the nearest integer.

Thus the block size for data compression in the multi-level cell mode is based on the number of bits stored in each cell, the compression factor, and a constant representing the amount of data required for the error detection and correction techniques. In a preferred embodiment, each cell in the solid state disk drive 120 stores two bits in the multi-level cell mode. As shown in FIG. 2, the software configuration also includes an error detection and correction (EDC) engine 255 for the multi-level cell implementation. In general, the EDC engine 255 reads ECC parameters, stored in the high density cell mode, and executes error correction and detection algorithms. In order to detect an error, the EDC engine 255 calculates new ECC parameters, and compares the calculated ECC parameters with the stored ECC parameters. If the ECC parameters match, then no errors are detected. If the ECC parameters do not match, then the EDC engine 255 executes error correction algorithms to correct the errors. Any EDC algorithm may be used. EDC algorithms are well known in the art and will not be described further.

PCMCIA Multi-Level Cell Implementation

Figure 3:
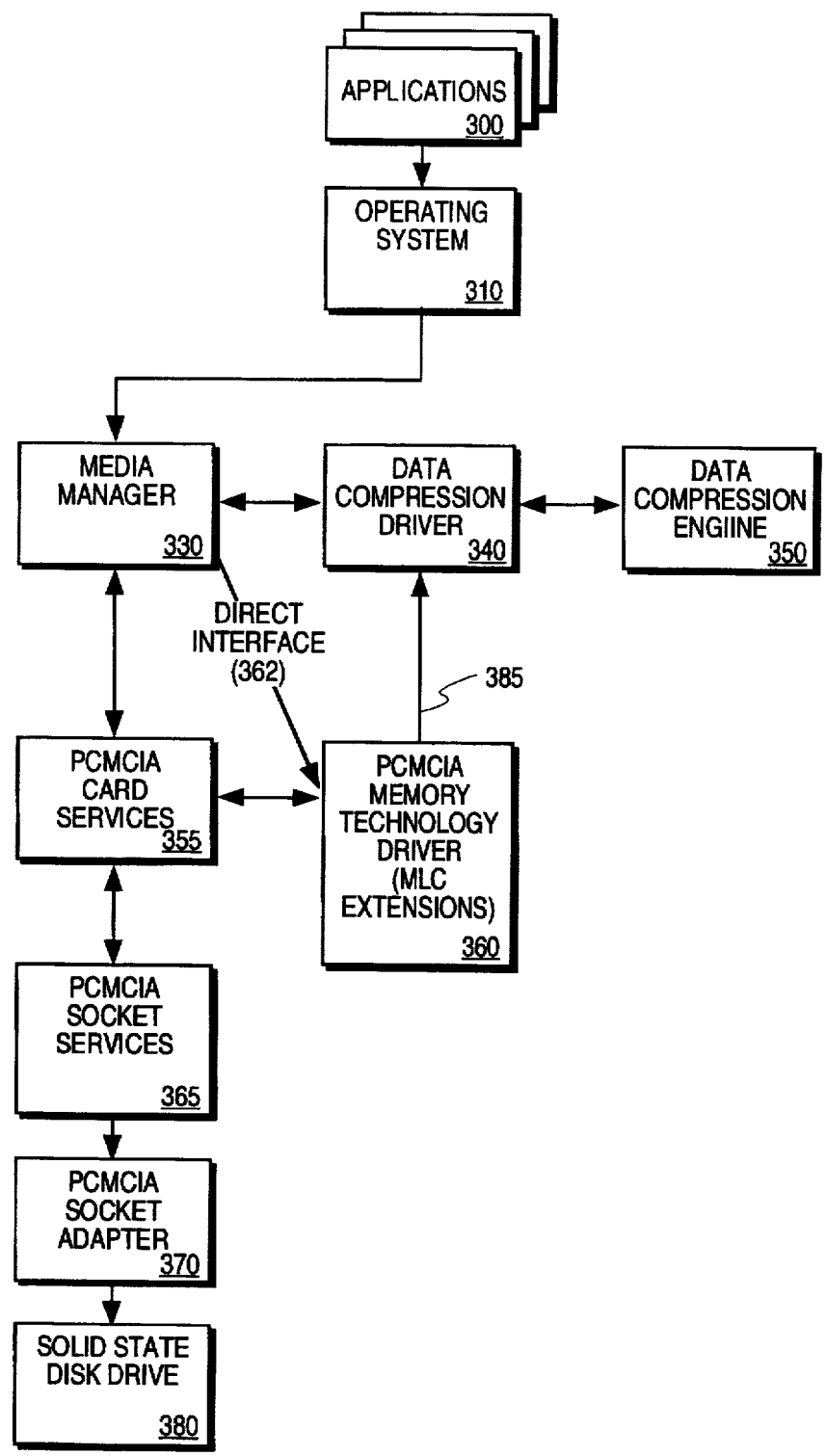
FIG. 3 illustrates one embodiment for a personal computer memory card industry association (PCMCIA) implementation for a multi-level cell solid state disk drive.

FIG. 3 illustrates one embodiment for a personal computer memory card industry association (PCMCIA) implementation for a multi-level cell solid state disk drive configured in accordance with the present invention. The PCMCIA implementation includes application(s) 300, operating system 310, media manager 330, data compression driver 340, and data compression engine 350. As discussed below, the media manager 330 includes a file system and a file system device driver. A solid state disk drive 380 is implemented in accordance with the PCMCIA standard. For the PCMCIA architecture, the solid state disk drive 380 may be implemented as either a resident flash array (RFA) or a personal computer memory card industry association personal computer (PCMCIA PC) card.

In order to interface the system software to the solid state disk drive 380, the configuration includes a PCMCIA card services module 355, PCMCIA socket services module 365, and PCMCIA socket adapter 370. The PCMCIA card services 355 provides device driver registration, status change call back, and host system resource allocation. The PCMCIA socket services 365 supports the hardware interface to the target solid state disk drive 380. The PCMCIA card services 355, PCMCIA socket services 365 and PCMCIA socket adapter 370 are configured in accordance with the PCMCIA standard. For more information on the PCMCIA specification, see Publication of the Personal Computer Memory Card International Association (PCMCIA) entitled: Card Services Specification; San Jose, Calif., February, 1995; and Publication of the Personal Computer Memory Card International Association (PCMCIA) entitled: Socket Services Specification; San Jose, Calif., February, 1995.

In a preferred embodiment, the present invention provides multi-level cell extensions without the need to alter the PCMCIA specific implementation modules. For the embodiment shown in FIG. 3, a PCMCIA memory technology driver (with multi-level cell extensions) 360 is provided to implement the multi-level cell extensions. For the preferred embodiment, the PCMCIA memory technology driver 360 executes the multi-level cell compression extensions algorithms and the error detection and correctional algorithms (e.g. the PCMCIA memory technology driver 360 contains the EDC engine). Also, the PCMCIA memory technology driver 360 isolates the technology specific algorithms for effectuating the solid state disk drive access primitives (e.g. multi-level cell read, multi-level cell write, multi-level cell copy, and multi-level cell erase operations). The multi-level cell read, write, copy and erase commands control the solid state disk drive 380 in the multi-level cell mode.

For the embodiment illustrated in FIG. 3, the media manager 330 is directly coupled to the PCMCIA memory technology driver 360 via a direct interface 362. The direct interface 362 provides a means for transferring command requests directly from the media manager 330 to the memory technology driver 360 without accessing the PCMCIA card services 355. Because the multi-level cell extension algorithms are implemented in the PCMCIA memory technology driver 360 and communicate to the media manager 330 via the direct interface 362, no modification to the PCMCIA standard modules is required. In addition, because the multi-level cell compression extensions are implemented in the PCMCIA memory technology driver 360, the data compression driver 340 may be generic such that no multi-level cell specific knowledge is required to implement the data compression driver 340.

For the preferred embodiment of implementing the multi-level cell compression algorithms in the PCMCIA memory technology driver 360, a software interface 385 is provided between the PCMCIA memory technology driver 360 and data compression driver 340. The software interface 385 passes data compression parameters (e.g. size of data block in high density cell mode). The software interface 385 may be implemented using any well known techniques for inter module communication.

In an alternative embodiment, the multi-level cell compression extensions may be executed as part of the data compression driver 340. However, for this implementation, modification of existing data compression drivers is required. Also, as an alternative embodiment, the EDC engine for the PCMCIA implementation could be implemented in software algorithms contained within the device driver (media manager 330), hardware contained on the PCMCIA socket adapter 370 (hardware interface), or hardware directly on the solid state disk drive (resident flash array or PCMCIA PC card).

As an alternative embodiment to providing a direct interface from the media manager 330 to the memory technology driver 360 via direct interface 362, the PCMCIA configuration may include an extended interface from PCMCIA card services 355 to the PCMCIA memory technology driver 360. In one embodiment for implementing the extended interface, the PCMCIA card services 355 includes additional operation codes (op codes) to identify the multi-level cell read, multi-level cell write, multi-level cell copy, and multi-level cell erase commands. For the direct interface 362 embodiment, the only additional operation codes required are those utilized to access the ECC parameters as is explained more fully below.

Multi-Level Cell Operations

Figure 4:
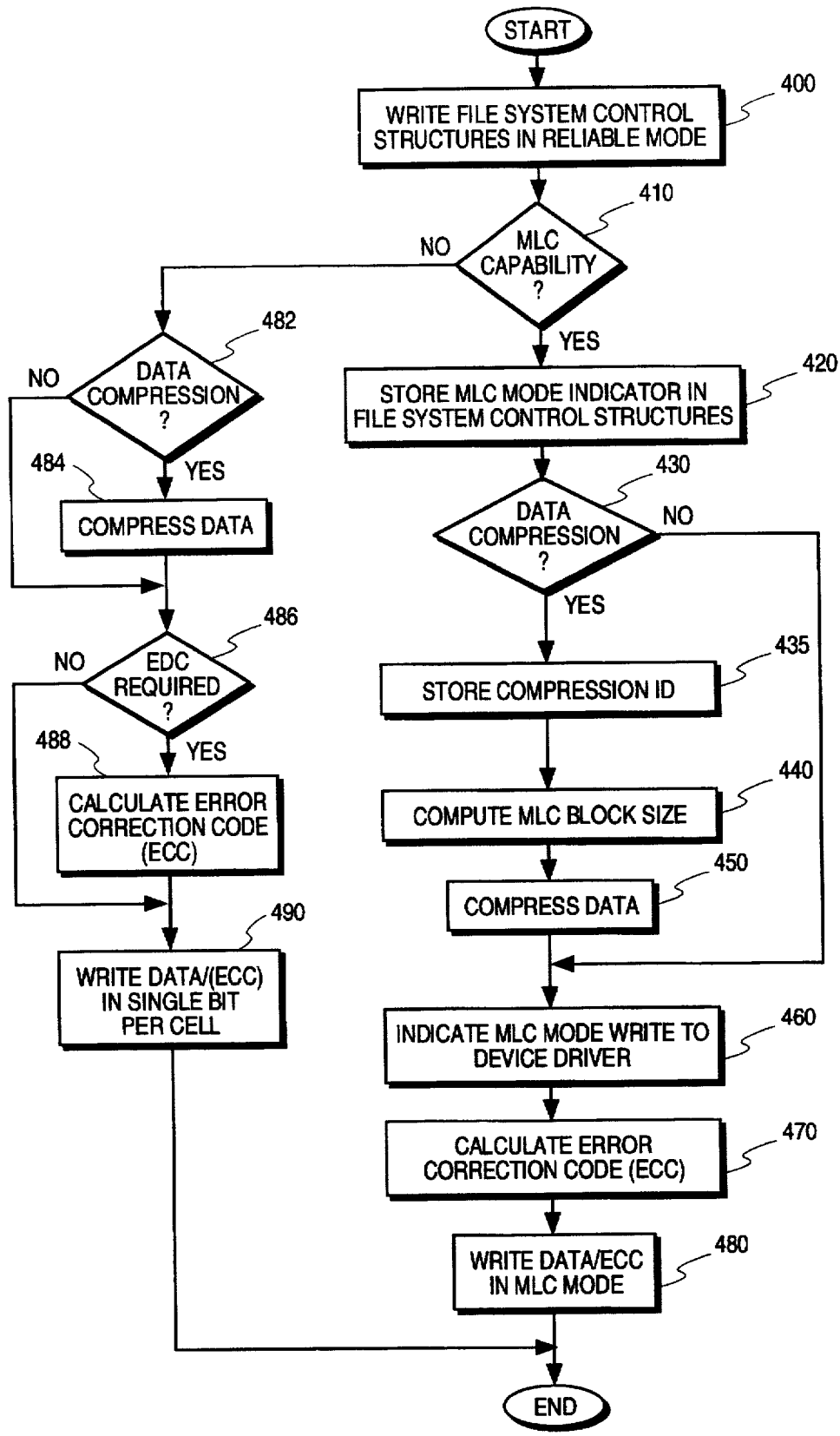
FIG. 4 is a flow diagram illustrating one embodiment of a file write operation.

FIG. 4 is a flow diagram illustrating a write operation in accordance with one embodiment of the multi-level cell extension configuration. The write operation is described in conjunction with the multi-level cell extension configuration illustrated in FIG. 2. As shown in block 400, the file system control information area for files being stored with the file system are written in the reliable mode. If the solid state disk drive has multi-level cell storage capability, then a multi-level cell identification (Multi-Level Cell ID) is stored in the file system control information as shown in steps 410 and 420. The multi-level cell ID indicates to the file system that the file data, corresponding to the file system control information, is stored in the high density mode.

As shown in steps 430 and 440 in FIG. 4, if the file data are compressed, then the multi-level cell block size is computed in accordance with the relationship discussed above. The data are compressed as shown in block 450, and a compression identification (ID) is stored in the control structure. The high density mode write is indicated to the file system device driver 225, and the EDC engine 255 calculates the error correctional code for the file data as shown in steps 460 and 470. The data and ECC code are written in the high density cell mode as shown in step 480.

In one embodiment, the file system device driver 225 notifies the file system 220 and data compression driver 230 of the presence of a multi-level cell capable medium. The data compression driver 230 generates a compression engine identification (ID). The compression engine ID specifies the multi-level cell compaction superimposed on the algorithmic data compression. The compression engine ID is stored in the standard reliable mode in the file system control information area that references the file data extents. The data compression driver 230 operates on the data from the data compression engine 235 by passing the data through the multi-level cell compression extensions. The multi-level cell compression executes the algebraic computation to compute the net bytes of physical media corresponding to the number of physical memory cells required to store the compressed multi-level cell data.

The file system 220 passes the compressed data to the file system device driver 225 by pointing to the output buffer used by the data compression engine 235. The file system 220 also transmits a flag to the file system device driver 225 to write the data in high density cell mode. The file system device driver 225 writes the data into the solid state disk drive 120, via the hardware interface 250, and the EDC engine 255 calculates the error correctional code (ECC). The ECC is stored along with the compressed/multilevel cell data, also in the high density cell mode. Alternatively, the data are stored in the multi-level cell mode only without the algorithmic data compression.

FIG. 4 also illustrates a write operation for a solid state disk drive that does not have multi-level cell storage capability. As shown in blocks 410, 482 and 484 in FIG. 4, if the solid state disk drive does not have multi-level cell storage capability and data compression is desirable, then data are compressed. If error detection and correction is required, then the error correction code (ECC) is calculated as shown in blocks 486 and 488. Subsequently, data, and ECC if EDC is required, are written to the solid state disk drive such that a single bit of data are stored in each cell as shown in block 480.

Figure 5:
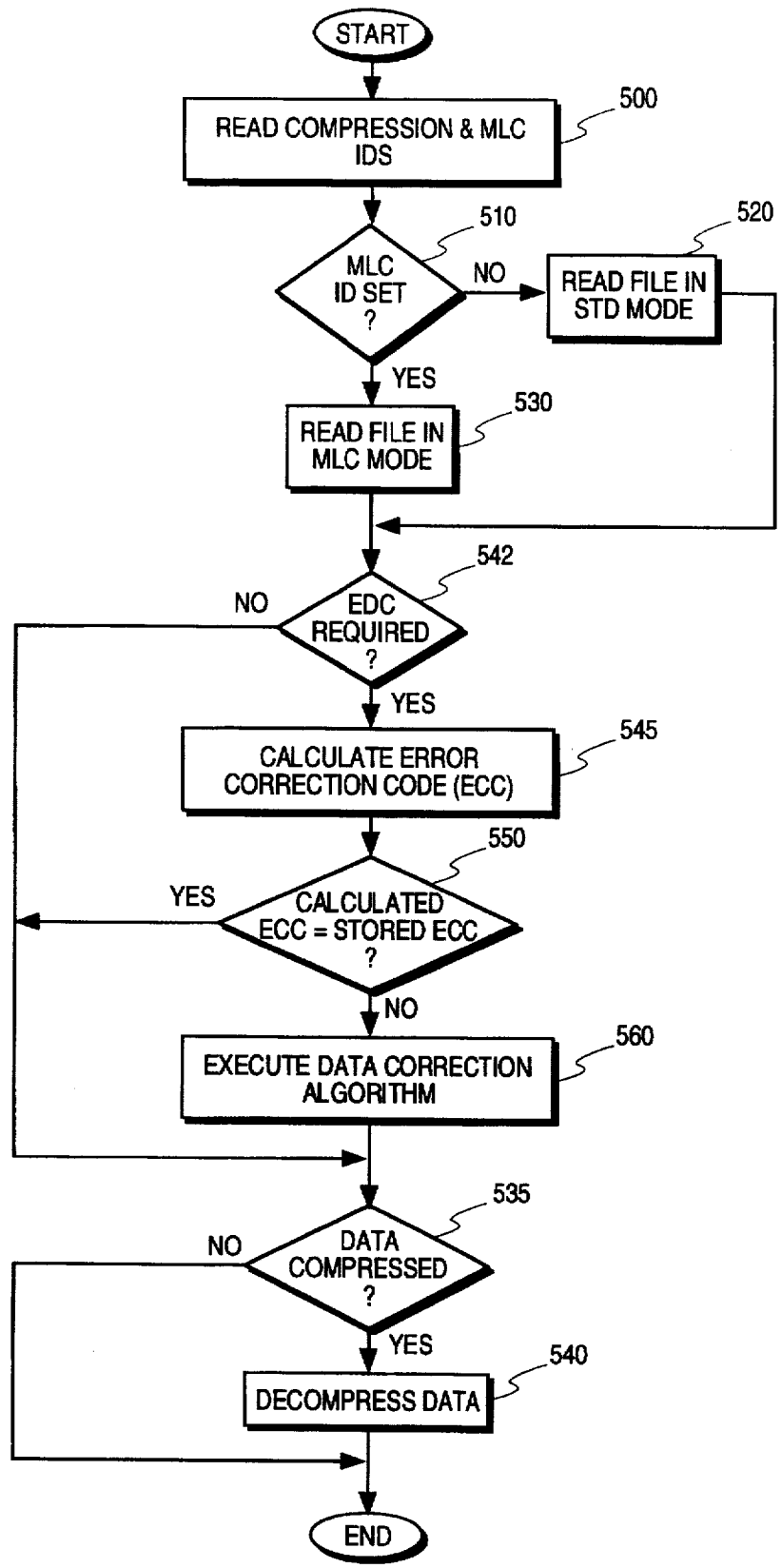
FIG. 5 illustrates one embodiment of a file read operation for the multi-level cell extensions.

FIG. 5 illustrates a file read operation for the multi-level cell extensions configured in accordance with one embodiment of the present invention. The multi-level cell file read operation is described in conjunction with the configuration illustrated in FIG. 2. In general, a read file operation is analogous to the write file operation in the reverse order. In block 500, the file system 220 reads the compression engine ID and the multi-level cell ID. Based on the state of the compression ID and the multi-level cell ID, the file system 220 invokes the data compression services from the data compression driver 230 and/or the multi-level cell compression extension services from the multi-level cell compression extensions 240. If the high density cell mode was utilized to store a particular data extent of a file, the file system 220 requests reading the data in the high density cell mode as shown in steps 510 and 530 on FIG. 5.

As shown in block 542, if error detection and correction (EDC) is required for the medium, then the file system 220 invokes the EDC engine 255 such that the file system 220 reads the data in high density cell mode, compares the calculated ECC with the stored ECC, and executes a data correction algorithm on the file extent if an error occurred (e.g. the calculated ECC did not compare with the stored ECC). This operation is shown in blocks 545, 550, and 560 on FIG. 5. The compression ID is utilized to determine if compression was used to store the data. If algorithmic data compression were used, the corrected multi-level cell data are transferred to the data buffer 237 for the data compression engine 235 decompression process. The data are decompressed in the data compression engine 235 as shown in blocks 535 and 540. The output data stored in the data buffer 237 is readable by the host system. Note that when a directory or other file read is performed by the file system such that the operating system requires a total file size calculated in bytes, the multi-level cell compression extension calculation for the multi-level cell compression factor may be used along with any shorthand attribute the data compression engine 235 may use to quickly calculate the total bytes.

When utilizing flash EPROM media for the solid state disk drive, clean-up operations are executed to transfer valid data from one block, sought to be erased, to another usable block. When the media manager 215 executes such a clean-up operation, all standard (non-multi-level cell stored) data extents are transferred to spare blocks using the prior standard copy command transferred to the device driver. When the file system encounters multi-level cell stored data extents, the file system uses the multi-level cell command.

In one embodiment for the full PCMCIA architecture, a flag or indication used for the multi-level cell read, multi-level cell write and multi-level cell copy operations is passed down to the solid state disk drive 380 through the card services 355, socket services 365, and PCMCIA socket adapter 370. The multi-level cell read, multi-level cell write, and multi-level cell copy operations may be implemented as an additional control bit in a software request packet for read and write, or two bits to handle the copy multi-level cell and copy standard multi-level cell cases. However, this implementation requires an expanded data structure through the card services 355 and memory technology driver 360 interfaces in addition to the modifications to the file system 220 and the file system device driver 225 interface.

In a second embodiment for the full PCMCIA architecture, the interfaces are modified such that a completely different binary code is utilized for each new command. However, for this second embodiment, the interfaces for the PCMCIA environment are not backward compatible with existing card services and memory technology drivers.

As discussed above, in a preferred embodiment for the PCMCIA architecture implementation, a direct interface 362 is utilized. The direct interface permits transferring of the multi-level cell read, multi-level cell write, multi-level cell copy and multi-level cell erase commands directly from the media manager 330 to the memory technology driver 360. In another embodiment, the media manager 330 passes the multi-level cell read, multi-level cell write, multi-level cell erase and multi-level cell copy commands through the card services 355 via a request packet. However, the card services 355 does not act on the request packet, but simply passes the packet to the memory technology driver 360. The extended commands are implemented through new data structures added on to the end of the existing request packet. For the standard card services interface, PCMCIA card services passes along the entire structure on the basis of the request packet length argument even if the current card services specification does not find such a request packet of that length.

Although the present invention has been described in terms of specific exemplary embodiments, it will be appreciated that various modifications and alterations might be made by those skilled in the art without departing from the spirit and scope of the invention as set forth in the following claims.

What is claimed is:

1. An apparatus for storing files, comprising:
   a nonvolatile memory comprising a plurality of memory cells, wherein each cell can store more than one bit of information;
   a file configuration system for accessing files stored in the nonvolatile memory, the file configuration system including a data compression unit and a multi-level cell extension unit;
   wherein the file configuration system stores file control information including storage mode and compression mode of corresponding file data using a reliable storage mode, wherein the file configuration system stores the file data in a selected one of the reliable mode and a high density mode in accordance with the storage mode, wherein the high density mode stores more bits per cell than the reliable mode;
   wherein the data compression unit compresses the file data before storage in accordance with the compression mode;
   wherein the multi-level cell extension unit generates a reliable mode equivalent block size (y) for the data compression unit in accordance with a reliable mode block size (x), a compression factor (n), the storage mode (w bits per cell), and any error correction bits (z), wherein $$y = \frac{x}{w * n} + z$$

2. The apparatus of claim 1 wherein the multi-level cell extension unit generates one of a multi-level cell write sequence, a multi-level cell read sequence, a multi-level cell copy sequence, and a multi-level cell erase sequence for the nonvolatile memory in response to one of a write request, read request, copy request, or erase request.

3. The apparatus of claim 1, wherein the file configuration system further comprises an error detection and correction (EDC) unit for detecting and correcting file data stored in the high density mode.

4. The apparatus of claim 1, wherein the memory cells comprise flash electrically programmable read only memory (EPROM) cells.

5. The apparatus of claim 1 wherein the nonvolatile memory supports bit write-ability such that the memory cells storing the file control information can be transitioned from a non-programmed state to a programmed state without erasure.

6. An apparatus for storing files, comprising:
   a nonvolatile memory comprising a plurality of memory cells, wherein each cell can store more than one bit of information;
   a file configuration system for accessing files stored in the nonvolatile memory, the file configuration system including a data compression unit and a multi-level cell extension unit; and
   a personal computer memory card industry association (PCMCIA) interface to interface the file configuration system with the nonvolatile memory;
   wherein the file configuration system stores file control information including storage mode and compression mode using a reliable storage mode, wherein the file configuration system stores file data corresponding to the file control information in a selected one of the reliable mode and a high density mode in accordance with the storage mode, wherein the high density mode stores more bits per cell than the reliable mode;
   wherein the data compression unit compresses the file data before storage in accordance with the compression mode;
   wherein the multi-level cell extension unit generates a reliable mode equivalent block size (y) for the data compression unit in accordance with a reliable mode block size (x), a compression factor (n), the storage mode (w bits per cell), and any error correction bits (z), wherein $$y = \frac{x}{w * n} + z$$

7. The apparatus of claim 6, wherein the file configuration system further comprises an error detection and correction (EDC) unit for detecting and correcting file data stored in the high density mode.

8. The apparatus of claim 6, wherein the memory cells comprise flash electrically programmable read only memory (EPROM) cells.

9. The apparatus of claim 6 wherein the nonvolatile memory supports bit write-ability such that the memory cells storing the file control information can be transitioned from a non-programmed state to a programmed state without erasure.

10. The apparatus of claim 6 wherein the multi-level cell extension unit generates one of a multi-level cell write sequence, a multi-level cell read sequence, a multi-level cell copy sequence, and a multi-level cell erase sequence for the nonvolatile memory in response to one of a write request, read request, copy request, or erase request.

* * * * *